(12) United States Patent
Refai-Ahmed et al.

(10) Patent No.: US 11,328,976 B1
(45) Date of Patent: May 10, 2022

(54) THREE-DIMENSIONAL THERMAL MANAGEMENT APPARATUSES FOR ELECTRONIC DEVICES

(71) Applicant: XILINX, INC., San Jose, CA (US)

(72) Inventors: Gamal Refai-Ahmed, Santa Clara, CA (US); Chi-Yi Chao, New Taipei (TW); Suresh Ramalingam, Fremont, CA (US); Hoa Lap Do, San Jose, CA (US); Anthony Torza, Oakland, CA (US); Brian D. Philofsky, Longmont, CO (US)

(73) Assignee: XILINX, INC., San Jose, CA (US)

( * ) Notice: Subject to any disclaimer, the term of this patent is extended or adjusted under 35 U.S.C. 154(b) by 85 days.

(21) Appl. No.: 16/808,023

(22) Filed: Mar. 3, 2020

(51) Int. Cl.
| | |
|---|---|
| *H01L 23/367* | (2006.01) |
| *H01L 23/467* | (2006.01) |
| *H01L 23/473* | (2006.01) |
| *H01L 23/42* | (2006.01) |

(52) U.S. Cl.
CPC .......... *H01L 23/3672* (2013.01); *H01L 23/42* (2013.01); *H01L 23/467* (2013.01); *H01L 23/473* (2013.01)

(58) Field of Classification Search
None
See application file for complete search history.

(56) References Cited

U.S. PATENT DOCUMENTS

| | | | | |
|---|---|---|---|---|
| 4,894,709 | A * | 1/1990 | Phillips | ............ F28F 3/12 |
| | | | | 257/714 |
| 9,812,374 | B1 | 11/2017 | Refai-Ahmed et al. | |
| 2015/0000886 | A1 * | 1/2015 | Lee | ............ F28D 15/02 |
| | | | | 165/185 |

FOREIGN PATENT DOCUMENTS

| | | | | |
|---|---|---|---|---|
| CN | 101208797 A | * | 6/2008 | ......... H01L 23/3672 |
| WO | WO-2013085465 A1 | * | 6/2013 | ............. F28F 3/086 |

OTHER PUBLICATIONS

"Measurement of Die Stresses in Microprocessor Packaging Due to Thermal and Power Cycling" by Roberts (Year: 2012).*
Image obtained from internet, URL: unknown, Access Date: prior to the filing of this application.

(Continued)

*Primary Examiner* — Evren Seven
(74) *Attorney, Agent, or Firm* — Patterson + Sheridan, LLP

(57) ABSTRACT

Some examples described herein provide for three-dimensional (3D) thermal management apparatuses for thermal energy dissipation of thermal energy generated by an electronic device. In an example, an apparatus includes a thermal management apparatus that includes a primary base, a passive two-phase flow thermal carrier, and fins. The thermal carrier has a carrier base and one or more sidewalls extending from the carrier base. The carrier base and the one or more sidewalls are a single integral piece. The primary base is attached to the thermal carrier. The carrier base has an exterior surface that at least a portion of which defines a die contact region. The thermal carrier has an internal volume aligned with the die contact region. A fluid is disposed in the internal volume. The fins are attached to and extend from the one or more sidewalls of the thermal carrier.

10 Claims, 7 Drawing Sheets

(56) References Cited

OTHER PUBLICATIONS

Refai-Ahmed, Gamal, et al. "Extending the Performance of High Heat Flex 2.5D and 3D Packaging from Component-System Interaction", 19th International Conference on Thermal, Mechanical and Muiti=Physics Simulation and Experiments in Microelectronics and Microsystems (EuroSimE), 2018 (6 pages).

Refai-Ahmed, Gamal, et al. "Extending the Performance of High Heat Flex 2.5D and 3D Packaging from Component-System Interaction", The American Society of Mechanical Engineers, InterPACK: Packaging and Integration of Electronic and Photonic Microsystems, Aug. 29-Sep. 1, 2017, conference presentation, (13 pages).

* cited by examiner

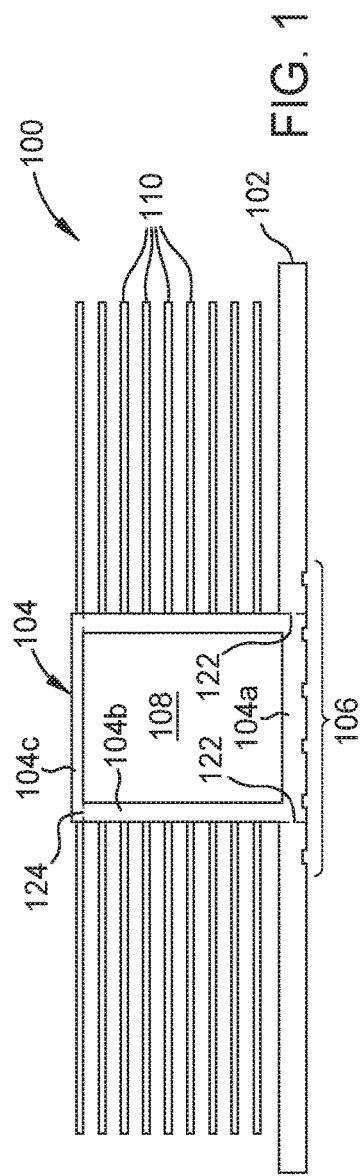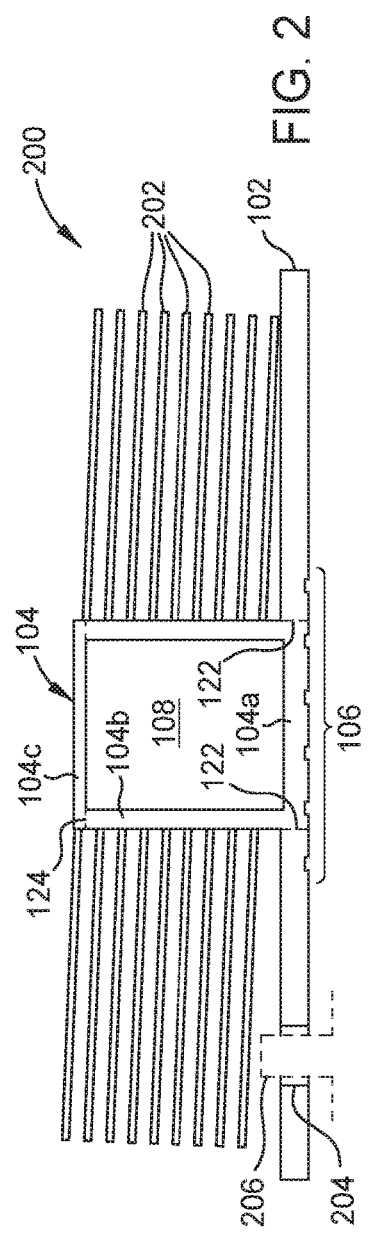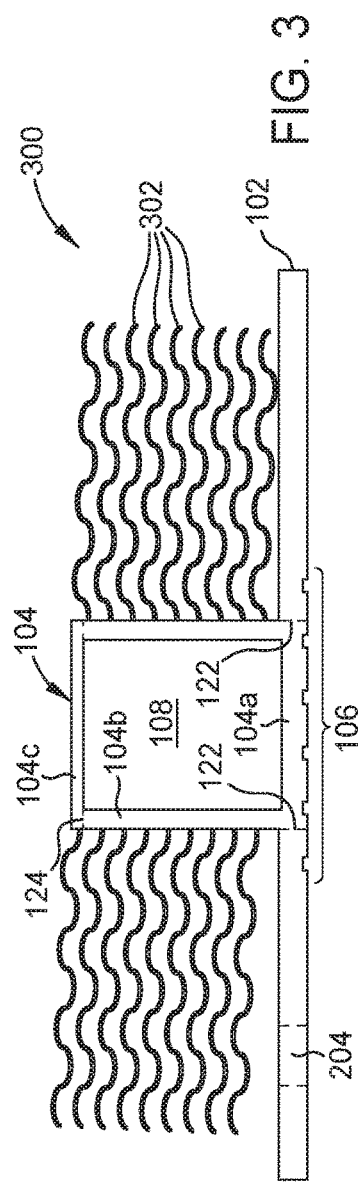

THREE-DIMENSIONAL THERMAL MANAGEMENT APPARATUSES FOR ELECTRONIC DEVICES

TECHNICAL FIELD

Examples of the present disclosure generally relate to three-dimensional thermal management apparatuses for electronic devices.

BACKGROUND

Electronic devices, such as are included in tablets, computers, copiers, digital cameras, smart phones, control systems, and automated teller machines, among others, often include integrated circuit die(s) for some desired functionality. Dies can consume various amounts of electrical power. By consuming electrical power, dies can generate thermal energy. The thermal energy can accumulate in the die if the thermal energy is not dissipated by the transfer of thermal energy. If thermal energy accumulates to too great of levels, and the die becomes too hot, deleterious effects may occur. For example, physical characteristics of devices in the die may be altered by excessive temperatures. As an example, threshold voltages of transistors in the die can vary as temperature changes. Further, migration of metal in the die can be increased by increased thermal energy. Accordingly, thermal management of electronic devices that include a die is a concern.

SUMMARY

Some examples described herein provide for three-dimensional (3D) thermal management apparatuses for thermal energy dissipation of thermal energy generated by an electronic device. The various 3D thermal management apparatuses described herein can improve dissipation of thermal energy.

An example of the present disclosure is an apparatus. The apparatus includes a thermal management apparatus. The thermal management apparatus includes a primary base, a passive two-phase flow thermal carrier, and fins. The passive two-phase flow thermal carrier has a carrier base and one or more sidewalls extending from the carrier base. The carrier base and the one or more sidewalls are a single integral piece. The primary base is attached to the passive two-phase flow thermal carrier. The carrier base has an exterior surface that at least a portion of which defines a die contact region. The passive two-phase flow thermal carrier has an internal volume aligned with the die contact region. A fluid is disposed in the internal volume. The fins are attached to and extend from the one or more sidewalls of the passive two-phase flow thermal carrier.

Another example of the present disclosure is an apparatus. The apparatus includes a thermal management apparatus. The thermal management apparatus includes a base, a passive two-phase flow thermal carrier, and fins. The base has a first internal volume and a die contact region. The passive two-phase flow thermal carrier has one or more sidewalls extending from the base. The passive two-phase flow thermal carrier has a second internal volume aligned with the die contact region. The second internal volume is fluidly coupled to the first internal volume to form an enclosed volume. A fluid is disposed in the enclosed volume. The fins are attached to and extend from the one or more sidewalls of the passive two-phase flow thermal carrier.

A further example of the present disclosure is a system. The system includes an electronic device, a thermal management apparatus, and a gas flow source. The electronic device includes a die and a substrate. The die is attached to the substrate by external connectors. The thermal management apparatus is disposed on the electronic device. The thermal management apparatus has a die contact region. A thermal interface material is disposed between and contacting the die contact region and the die. The thermal management apparatus includes a base, a passive two-phase flow thermal carrier, and fins. The passive two-phase flow thermal carrier has one or more sidewalls extending from the base. The passive two-phase flow thermal carrier has an internal volume aligned with the die contact region. A fluid is in the internal volume. The fins are attached to and extend from the one or more sidewalls of the passive two-phase flow thermal carrier. Each of the fins is rectangular-shaped in a plane from which the respective fin extends from the one or more sidewalls of the passive two-phase flow thermal carrier. The gas flow source is oriented to direct a flow of gas towards the thermal management apparatus when the gas flow source is in operation. A direction of the flow of gas is non-perpendicular to edges of the fins.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 1 is a first three-dimensional (3D) thermal management apparatus according to some examples.

FIG. 2 is a second 3D thermal management apparatus according to some examples.

FIG. 3 is a third 3D thermal management apparatus according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 4:
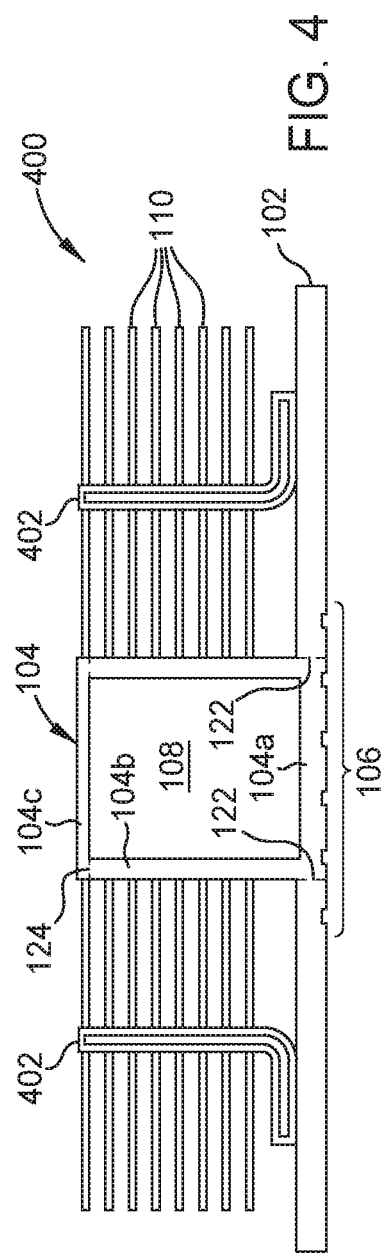
FIG. 4 is a fourth 3D thermal management apparatus according to some examples.

Some examples described herein provide for three-dimensional (3D) thermal management apparatuses for thermal energy dissipation of thermal energy generated by an electronic device. The various 3D thermal management apparatuses described herein can improve dissipation of thermal energy.

In some examples described herein, a 3D thermal management apparatus can include a horizontal base and a vertical passive two-phase flow thermal carrier. A base portion of the passive two-phase flow thermal carrier and sidewalls of the passive two-phase flow thermal carrier are integrally formed as a single piece. A die contact region can be defined at least in part by a surface of the base portion of the passive two-phase flow thermal carrier. Having such an integral construction and die contact region can avoid joints between the vertical passive two-phase flow thermal carrier and a die on which the 3D thermal management apparatus is dispose. Different materials, such as solder, could be introduced at such joints that could increase thermal resistivity. Hence, avoiding such joints can permit reduced thermal resistivity for conducting thermal energy.

In some examples described herein, a 3D thermal management apparatus can include a horizontal base and a vertical passive two-phase flow thermal carrier, with each having respective internal volumes that are fluidly coupled together to form an enclosed volume. A fluid is in the enclosed volume. The portion of the enclosed volume within the base can permit additional or more efficient dissipation of thermal energy through the base.

In some examples described herein, a 3D thermal management apparatus can include a horizontal base, a vertical passive two-phase flow thermal carrier, and fins. The fins can be planar or corrugated (or the like). The fins can be in a horizontal or non-horizontal configuration. Different fins and/or configurations can improve dissipation of thermal energy from the fins.

In some examples described herein, a 3D thermal management apparatus on an electronic device is oriented relative to a gas flow source (e.g., a fan) that increases a cross-section that the flow of gas from the gas flow source contacts. The increased cross-section can permit improved contact of the gas to, e.g., fins, which can improve dissipation of thermal energy.

Other features and aspects that can be incorporated into a 3D thermal management apparatus or used in conjunction with a 3D thermal management apparatus are described herein. The various features and aspects can be combined to achieve a number of permutations of 3D thermal management apparatuses.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIGS. 1 through 5 illustrate example 3D thermal management apparatuses according to some examples. Various aspects or features are described with respect to the illustrated examples. Other examples contemplate that the described aspects or features can be combined in different ways and with different aspects or features.

Referring to a first 3D thermal management apparatus 100 in FIG. 1, a horizontal base 102 is attached to a vertical passive two-phase flow thermal carrier 104 ("thermal carrier 104" for convenience below), such as a vertical heat pipe. The vertical thermal carrier 104 and/or horizontal base 102 have a contact region 106 to which, e.g., a thermal interface material (TIM) is to contact or adhere. The contact region 106 of the vertical thermal carrier 104 and/or horizontal base 102 has channels or recesses micro-machined or etched into the vertical thermal carrier 104 and/or horizontal base 102. When the first 3D thermal management apparatus 100 is used with an electronic device, air in the TIM can settle in the channels or recesses in the contact region 106, which can permit the vertical thermal carrier 104 and horizontal base 102 to be closer to a die on which the TIM is disposed. The closer the vertical thermal carrier 104 and horizontal base 102 are to the die, the less thermal resistance may be present between the first 3D thermal management apparatus 100 and the die, which can permit increased conductivity of thermal energy from the die to the first 3D thermal management apparatus 100 for dissipation. The contact region 106, in which the channels or recesses are formed, may protrude from the vertical thermal carrier 104 and horizontal base 102 in some examples, although the contact region 106 does not protrude from the vertical thermal carrier 104 and horizontal base 102 in the illustrated example. In some examples, the contact region 106 may not have channels or recesses.

The horizontal base 102 is a solid plate with an opening therethrough, in the illustrated example. The opening through the horizontal base 102 aligns with the contact region 106, and the vertical thermal carrier 104 is inserted in and attached (at joint 122) at the opening to the horizontal base 102. The horizontal base 102 can be substantially a cuboid having a thin thickness in a direction normal to the contact region 106 (e.g., the surface of the vertical thermal carrier 104 and/or horizontal base 102 that defines the contact region 106 without consideration of any channels or recesses), for example. The horizontal base 102 extends horizontally from the vertical thermal carrier 104 and/or the contact region 106 (e.g., in a direction parallel to the surface of the vertical thermal carrier 104 and/or horizontal base 102 that defines the contact region 106).

The vertical thermal carrier 104 has a base 104a, sidewalls 104b, and a cap 104c. The sidewalls 104b extend vertically from the base 104a (e.g., in a direction perpendicular to the exterior surface of the base 104a that defines at least part of the contact region 106). The sidewalls 104b are integrally formed with the base 104a. The cap 104c is joined to the sidewalls 104b (e.g., by brazing or solder) at a joint 124 at a position distal from the base 104a. The base 104a and, possibly, portions of the sidewalls 104b of the vertical thermal carrier 104 are inserted into the opening of the horizontal base 102. An exterior surface of the base 104a is substantially coplanar with a bottom surface of the horizontal base 102. In that position, the vertical thermal carrier 104 is attached at joint 122 to the horizontal base 102. The horizontal base 102 further extends horizontally from the sidewalls 104b of the vertical thermal carrier 104. The base 104a has an exterior surface that forms at least part of the contact region 106. The contact region 106 can be defined within the exterior surface of the base 104a (e.g., without being on any surface of the horizontal base 102), or can be defined on the exterior surface of the base 104a and the bottom surface of the horizontal base 102, like illustrated. The vertical thermal carrier 104 has an enclosed volume 108 therein (e.g., as defined by the base 104a, sidewalls 104b, and cap 104c). The enclosed volume 108 aligns with the contact region 106 in a direction normal to the contact region 106. For example, the enclosed volume 108 (e.g., a portion thereof) can align with the contact region 108 (e.g., a portion thereof) in a direction normal to the contact region 106 even if, e.g., some portion of the enclosed volume 108 may not align with any portion of the contact region 108 in the direction, or vice versa.

As stated, the vertical thermal carrier 104 has a base 104a and sidewalls 104b that are formed integrally, and the base 104a forms as least part of the contact region 106 in this example. Hence, in this example, an additional material, such as a solder, that can increase a thermal resistivity can be omitted between the vertical thermal carrier 104 and the TIM that contacts a die.

A thermal wick can be formed on the base 104a and sidewalls 104b of the vertical thermal carrier 104 that define the enclosed volume 108. The thermal wick can be formed by brazing the base 104a and sidewalls 104b. The vertical thermal carrier 104 can be substantially cylindrical, cuboid, or another shape, and the enclosed volume 108 can correspond to the shape of the vertical thermal carrier 104. In illustrated examples, the vertical thermal carrier 104 and the enclosed volume 108 have respective cylindrical shapes. A fluid, such as water or another heat-conducting fluid, is contained within the enclosed volume 108 of the vertical thermal carrier 104.

Planar fins 110 extend horizontally (e.g., in respective planes parallel to the surface of the vertical thermal carrier 104 and/or horizontal base 102 that defines the contact region 106) from the sidewalls 104b of the vertical thermal carrier 104. Each of the planar fins 110 extends in a plane perpendicular to an exterior surface of the sidewalls 104b of the vertical thermal carrier 104, and extends parallel to the others of the planar fins 110. Each of the planar fins 110 is mechanically attached to the sidewalls 104b of the vertical thermal carrier 104, such as by solder. Further, each of the planar fins 110 extends radially from and around the vertical thermal carrier 104. Each of the planar fins 110 can have a surface distal from the horizontal base 102 that is a rectangular shape (e.g., a square), and the vertical thermal carrier 104 can extend through an opening through a center of the rectangular shape of each of the planar fins 110. In some examples, the shape of each of the planar fins 110, in an above layout view, corresponds to the shape of the horizontal base 102. In some examples, respective edges of the shapes of the planar fins 110 may or may not be aligned with edges of the shape of the horizontal base 102 in an above layout view. In some examples, each of the planar fins 110 may not extend around the vertical thermal carrier 104.

The horizontal base 102, vertical thermal carrier 104, and planar fins 110 may be any appropriate thermally conductive material, such as copper, aluminum, or another material. The horizontal base 102, vertical thermal carrier 104, and planar fins 110 can be formed using any appropriate machining process, for example. The thermal wick in the enclosed volume 108 can be formed by brazing using, for example a copper powder or other appropriate powder brazed at a high temperature and in a vacuum environment.

In operation, thermal energy can be generated by a die, and that thermal energy can be conducted to the contact region 106. The thermal energy can be conducted in any of three dimensions from the contact region 106. The thermal energy can be conducted laterally or horizontally through the base 104a and horizontal base 102 and can thereafter be dissipated from the horizontal base 102. The thermal energy can also be conducted vertically by the vertical thermal carrier 104 where the thermal energy is conducted to the fluid in the enclosed volume 108 at the base 104a. The fluid (e.g., liquid), upon receiving the thermal energy, can become vaporized, and the vapor can circulate or move by convection within the enclosed volume 108. The vapor can contact the sidewalls 104b of the vertical thermal carrier 104, which permits thermal energy to be conducted to those sidewalls 104b and thereafter to the planar fins 110. Thermal energy conducted from the vapor can permit the vapor to condense and flow back to the base 104a. Thermal energy conducted to the planar fins 110 can thereafter be conducted laterally or horizontally through the planar fins 110 and dissipated from the planar fins 110. Thermal energy dissipated from the horizontal base 102, vertical thermal carrier 104, and/or planar fins 110 can be removed by, e.g., gas (e.g., air) flow in and around the horizontal base 102, vertical thermal carrier 104, and planar fins 110.

Referring to a second 3D thermal management apparatus 200 in FIG. 2, planar fins 202 extend non-horizontally (e.g., in respective planes non-parallel to the surface of the vertical thermal carrier 104 and/or horizontal base 102 that defines the contact region 106) from the sidewalls 104b of the vertical thermal carrier 104. Each of the planar fins 202 extends in a plane that is non-perpendicular to an exterior surface of the sidewalls 104b of the vertical thermal carrier 104 in at least one direction, and extends parallel to the others of the planar fins 202. The second 3D thermal management apparatus 200 includes a horizontal base 102 and vertical thermal carrier 104 like described above with respect to FIG. 1, and the planar fins 202 are attached to the vertical thermal carrier 104, such as by solder. The planar fins 202 are like the planar fins 110 of FIG. 1 except being non-horizontal.

It is noted that planar fins 202 may extend in respective planes that are perpendicular to the sidewall(s) of the vertical thermal carrier 104 in another direction and/or from a different perspective. For example, assume that the illustration of FIG. 2 is along an X-Z cross-section through the second 3D thermal management apparatus 200; a Y-Z cross-section through the second 3D thermal management apparatus 200 would show the planar fins 202 extending perpendicular to the sidewalls of the vertical thermal carrier 104 shown by that cross-section, like shown in FIG. 1. The planar fins 202 can cause deflection of gas (e.g., air) flow by being non-horizontal, which can increase dissipation of thermal energy from the planar fins 202 to that gas.

Additionally, the horizontal base 102 can have an opening 204 at a location where the angle of the planar fins 202 provides a significant clearance between the bottom planar fin 202 and the horizontal base 102. The opening 204 can be implemented for insertion of a surface mount device 206 (e.g., a capacitor) that is mounted on, e.g., a printed circuit board (PCB) through the horizontal base 102. The surface mount device can therefore be closer in proximity to a package and die that implements the 3D thermal management apparatus 200.

Referring to a third 3D thermal management apparatus 300 in FIG. 3, corrugated fins 302 extend non-horizontally (e.g., in respective planes non-parallel to the surface of the vertical thermal carrier 104 and/or horizontal base 102 that defines the contact region 106) from the sidewalls 104b of the vertical thermal carrier 104. Each of the corrugated fins 302 extends in a plane that is non-perpendicular to an exterior surface of the sidewalls 104b of the vertical thermal carrier 104 in at least one direction, and extends parallel to the others of the corrugated fins 302. The second 3D thermal management apparatus 200 includes a horizontal base 102 and vertical thermal carrier 104 like described above with respect to FIGS. 1 and 2, and the corrugated fins 302 are attached to the vertical thermal carrier 104, such as by solder. The corrugated fins 302 are like the planar fins 202 of FIG. 2 except being corrugated. The corrugated fins 302 can increase the area that a gas (e.g., air) can contact the corrugated fins 302 for a given distance extending from the vertical thermal carrier 104 (e.g., for a given footprint of the corrugated fins 302). The corrugated fins 302 can also further deflect and disrupt gas flow, which can increase dissipation of thermal energy from the corrugated fins 302 to that gas. In other examples, the fins can be dimpled, grooved, rippled, or the like in other ways that increase area of the fins and/or disrupt gas or air flow.

Corrugated fins may be implemented in a 3D thermal management apparatus in a non-horizontal configuration like shown in FIG. 3 or may be implemented in a horizontal configuration similar to the first 3D thermal management apparatus 100 of FIG. 1, except with corrugated fins. Since corrugated fins have varying curved surfaces, whether the corrugated fins are horizontal or non-horizontal can be determined based on an average trajectory or extension of the fins, rather than at any instantaneous point.

Referring to a fourth 3D thermal management apparatus 400 in FIG. 4, the fourth 3D thermal management apparatus 400 further includes passive two-phase flow thermal carriers 402 (e.g., heat pipes). Each of the thermal carriers 402 includes a horizontal or lateral portion that extends along the horizontal base 102 and a vertical portion that extends away from the horizontal base 102 and through the planar fins 110. Generally, each of the thermal carriers 402 is L-shaped. An enclosed volume is formed fluidly connected through the horizontal or lateral portion and the vertical portion of each of the thermal carriers 402. The thermal carriers 402 can be any appropriate thermally conductive material, such as copper, aluminum, or another material. The thermal carriers 402 can be mechanically attached to the horizontal base 102 and planar fins 110 by solder, for example.

A fluid, such as water or another heat-conducting fluid, is contained within the enclosed volume of each of the thermal carriers 402. A person having ordinary skill in the art will readily understand that the thermal carriers 402 can conduct thermal energy like the vertical thermal carrier 104 as described previously, and hence, description of such thermal energy conduction is omitted for brevity here. The thermal carriers 402 can increase conduction of thermal energy vertically to the planar fins 110 and can provide additional mechanical support for the planar fins 110. The thermal carriers 402 can be implemented with any of the above-described fins, which may be planar or corrugated (or the like), and may be implemented in a horizontal or non-horizontal configuration.

Figure 5:
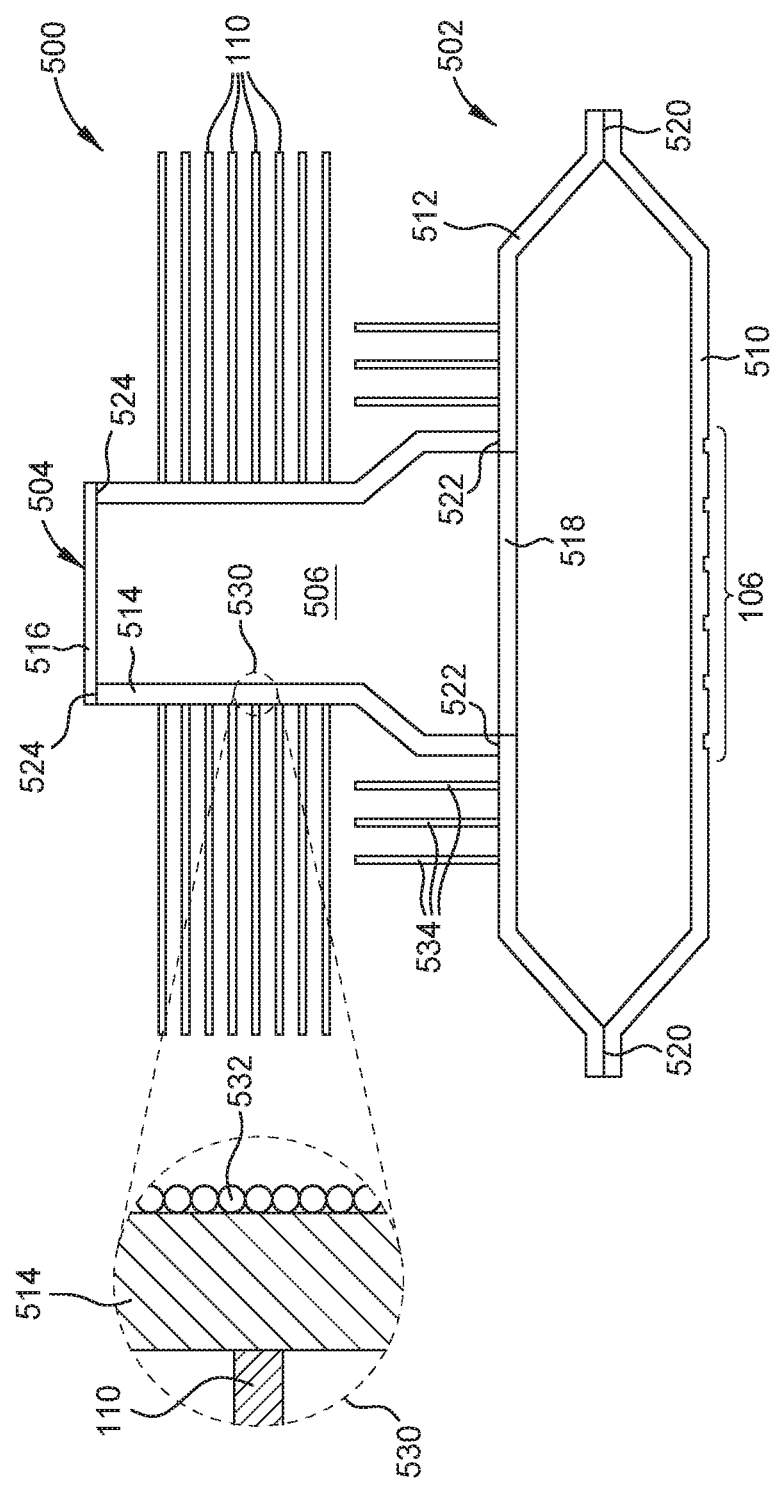
FIG. 5 is a fifth 3D thermal management apparatus according to some examples.

Referring to a fifth 3D thermal management apparatus 500 in FIG. 5, a horizontal base 502 and vertical passive two-phase flow thermal carrier 504 are formed with a fluidly connected enclosed volume 506 in and between the horizontal base 502 and the thermal carrier 504. The enclosed volume 506 extends laterally or horizontally in the horizontal base 502 and extends vertically in the vertical thermal carrier 504. The horizontal base 502 and vertical thermal carrier 504 together form a larger passive two-phase flow thermal carrier. In some examples, various components of the horizontal base 502 and vertical thermal carrier 504 can be integrally formed. In the illustrated example, the horizontal base 502 includes a lower plate 510 and an upper plate 512 joined together at a joint 520 near or at the periphery of the lower plate 510 and upper plate 512. The vertical thermal carrier 504 includes a flared tube 514 joined at a joint 522 to the upper plate 512 at an opening 518 through the upper plate 512 vertically aligned with the contact region 106 on the lower plate 510. The flared tube 514 has first vertical sidewalls, flared sidewalls, and second vertical sidewalls, where the flared sidewalls connect to and between the first vertical sidewalls and the second vertical sidewalls. A diameter of the flared tube 514 is larger between the first vertical sidewalls than between the second vertical sidewalls, and the diameter of the flared tube 514 decreases traversing the flared sidewalls in a direction from the first vertical sidewalls to the second vertical sidewalls. The first vertical sidewalls of the flared tube 514 are connected to and proximate to the upper plate 512 of the horizontal base 502 at the joint 522. A cap 516 is joined at a joint 524 to the flared tube 514 (e.g., the second vertical sidewalls) distal from the horizontal base 502.

The lower plate 510, upper plate 512, and tube 514 may be any appropriate thermally conductive material, such as copper, aluminum, or another material. One or both of the lower plate 510 and upper plate 512 can be machined or pressed to have a depression or concave surface such that, when the lower plate 510 and upper plate 512 are joined, the portion of the enclosed volume 506 in the horizontal base 502 is formed. The lower plate 510 can have channels or recesses machined or etched in the contact region 106. The upper plate 512 is machined to have a circular opening 518 at a position that is or is to be vertically aligned with the contact region 106 on the lower plate 510, where the circular opening 518 has a diameter that is equal or less to the inner diameter at the first vertical sidewalls of the flared tube 514.

As illustrated by inset 530, a thermal wick 532 is formed on the surfaces of the lower plate 510, upper plate 512, and tube 514 that define the enclosed volume 506. For example, the surfaces can be brazed, such as by using copper powder at a high temperature and in a vacuum environment. The thermal wick 532 can be or include, for example, copper particles that are adhered to the interior surfaces that define the enclosed volume 506, which can increase surface area for thermal energy transfer. The lower plate 510, upper plate 512, tube 514, and cap 516 are then joined in the arrangement as illustrated in FIG. 5 and joined together at the joints 520, 522, 524. The lower plate 510 and upper plate 512 can be brazed or soldered together at the joint 520 to form the horizontal base 502, and the tube 514 can be brazed or soldered to the upper plate 512 at the joint 522 where the inner volume of the flared tube 514 aligns with the circular opening 518 of the upper plate 512. The cap 516 can be brazed or soldered to the tube 514 at the joint 524. Brazing or soldering the lower plate 510 and the upper plate 512 together forms a seal at the joint 520. Brazing or soldering the upper plate 512 and the tube 514 together forms a seal at the joint 522. Brazing or soldering the cap 516 and the tube 514 together forms a seal at the joint 524, although an opening may be through the cap 516 and/or tube 514 for insertion of a fluid to the volume 506.

Fluid, such as water or another heat-conducting fluid, is then inserted into the volume created between the lower plate 510 and upper plate 512 and/or in the tube 514 via the opening through the tube 514 and/or cap 516. Following the insertion of the fluid, the opening is closed and sealed, such as by clamping and/or by soldering at the opening. The enclosed volume 506 is therefore sealed with the fluid therein.

FIG. 5 illustrates planar fins 110 mechanically attached to and extending from the vertical thermal carrier 504 (e.g., from the second vertical sidewalls of the flared tube 514), like illustrated in and described above with respect to FIG.

1. Any fins, such as planar fins or corrugated fins (or the like), may be implemented and may be attached to and extending from the vertical thermal carrier 504. The fins can be in a horizontal or non-horizontal configuration like described above. Additionally, thermal carriers 402 may be implemented on and extending along the horizontal base 502 (e.g., upper plate 512) and away from the horizontal base 502 and through the fins. FIG. 5 further illustrates vertical fins 534 extending vertically from the upper plate 512 of the horizontal base 502. The vertical fins 534 can be implemented or omitted in any example. A person having ordinary skill in the art will readily understand such modifications to the fifth 3D thermal management apparatus 500 illustrated in FIG. 5.

The fifth 3D thermal management apparatus 500 can conduct thermal energy like described above with respect to FIG. 1. Additionally, thermal energy can be conducted by lateral movement or flow of fluid within the horizontal base 502. The fluid (e.g., liquid), upon receiving the thermal energy at the contact region 106, can become vaporized, and the vapor can circulate or move laterally or horizontally by convection within the enclosed volume 506. The vapor can contact surfaces of the horizontal base 502 that are laterally distal from the contact region 106, which permits thermal energy to be conducted to those surfaces. Thermal energy conducted from the vapor can permit the vapor to condense and flow back to near the contact region 106 of the horizontal base 502. Thermal energy conducted laterally distal from the contact region 106 within the horizontal base 502 can thereafter be dissipated from the horizontal base 502. When vertical fins 534 are implemented, thermal energy can be conducted from the upper plate 512 of the horizontal base to the vertical fins 534 where the thermal energy can be dissipated.

Figure 6:
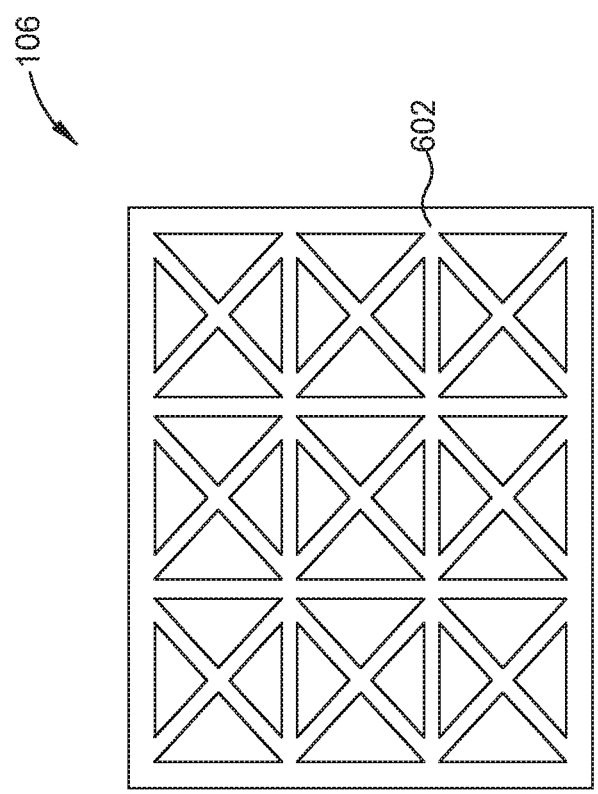
FIG. 6 is a channel pattern of a contact region of a thermal management apparatus according to some examples.

FIG. 6 illustrates an example channel pattern of a contact region 106 according to some examples. The contact region 106 includes channels 602 machined or etched into a base (e.g., base 104a and/or horizontal base 102). The channels 602 cross at a number of intersections. A first subset of channels 602 extend in a first direction (e.g., vertically in the illustration), and a second subset of channels 602 extend perpendicularly (e.g., horizontally in the illustration) to the first direction and intersect the first subset of channels 602 at a number of locations. A third subset of channels 602 extend in a direction at a forty-five degree angle from the first direction, and a fourth subset of channels 602 extend in a direction at a one hundred thirty-five degree angle from the first direction and perpendicularly to the direction that the third subset of channels 602 extend. The fourth subset of channels 602 intersect the third subset of channels 602 where the first subset and second subset of channels 602 intersect and at centers in the quadrilateral shapes formed by the first and second subset of channels 602. Neighboring, parallel pairs of the first and second subset of channels 602 have a first pitch, and neighboring, parallel pairs of the third and fourth subset of channels 602 have a second pitch that is approximately half of the first pitch.

Figure 7:
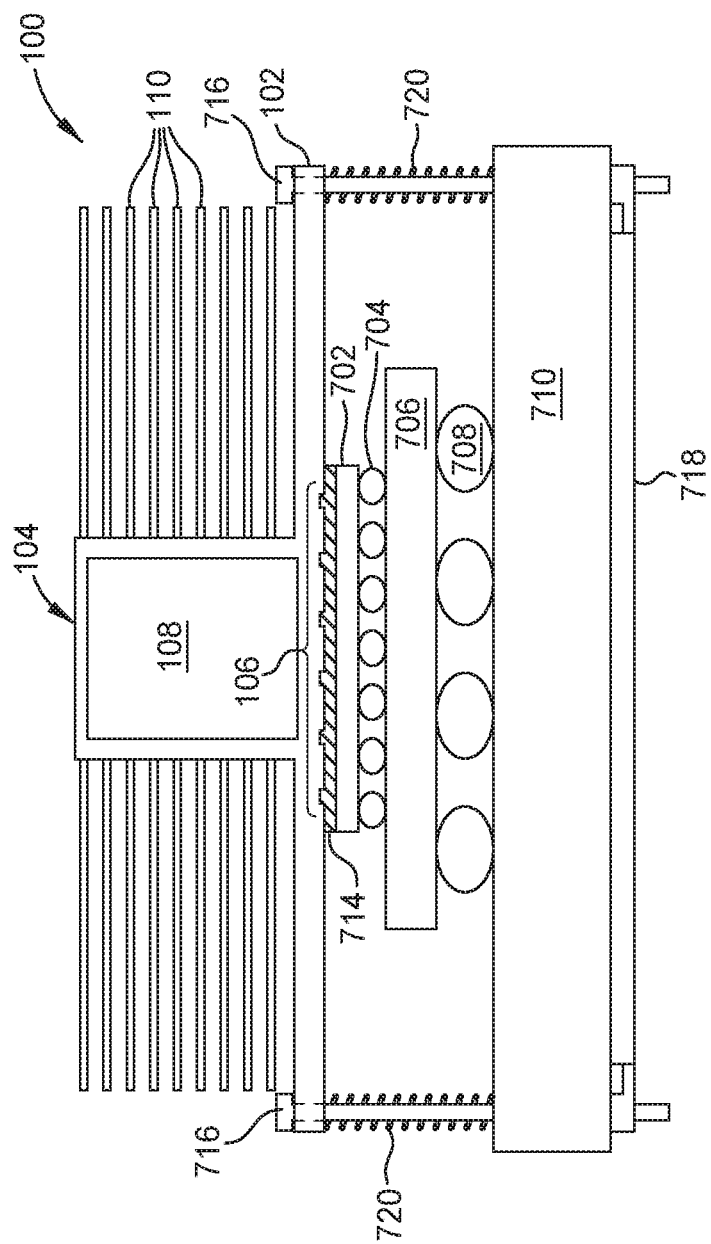
FIG. 7 shows the first 3D thermal management apparatus on an electronic device according to some examples.

FIG. 7 illustrates the first 3D thermal management apparatus 100 on an electronic device according to some examples. Although the first 3D thermal management apparatus 100 is illustrated in FIG. 7, any of the 3D thermal management apparatuses 100, 200, 300, 400, 500 and any modifications thereto can be implemented on the electronic device. A person having ordinary skill in the art will readily understand modifications to the illustration of FIG. 7 to achieve such implementations.

The electronic device includes a die 702 attached, by external connectors 704, to a substrate 706. The die 702 can have or include any integrated circuit formed thereon. The external connectors 704 can be, for example, microbumps, controlled collapse chip connections (C4), or the like. The external connectors 704, at least in part, form a mechanical connection between the die 702 and the substrate 706, and form electrical couplings between the die 702 and the substrate 706 for communication of signals, a power supply, and/or a ground therebetween. The substrate 706 can be an interposer, a package substrate, or the like, and can include various metal routing and/or vias for communicating signals, a power supply, and/or ground. External connectors 708 connect the electronic device (e.g., the substrate 706) to PCB 710. The external connectors 708 can be, for example, ball grid array (BGA) balls or the like. The external connectors 708, at least in part, form a mechanical connection between the substrate 706 and the PCB 710, and form electrical couplings between the substrate 706 and the PCB 710 for communication of signals, a power supply, and/or a ground therebetween.

A TIM 714, such as thermal grease, is on and contacting a side of the die 702 opposite from the external connectors 704. The contact region 106 of the first 3D thermal management apparatus 100 is placed on and contacting the TIM 714 such that a thermally conductive path is formed between the die 702 and the first 3D thermal management apparatus 100. The first 3D thermal management apparatus 100 is secured to the electronic device and/or PCB 710, such as by screws 716, bracket 718, and springs 720. The screws 716 are inserted through openings at, e.g., corners of the horizontal base 102, through springs 720 and the PCB 710, and are screwed into the bracket 718. The first 3D thermal management apparatus 100 can be fixedly secured on the electronic device using other techniques and/or components.

Other components can be included in the electronic device. For example, an encapsulant, such as a molding compound, can be included to encapsulate the die on the substrate 706. Additionally, a ring stiffener can be on and attached to the substrate 706. Other components can also be implemented.

Figure 8:
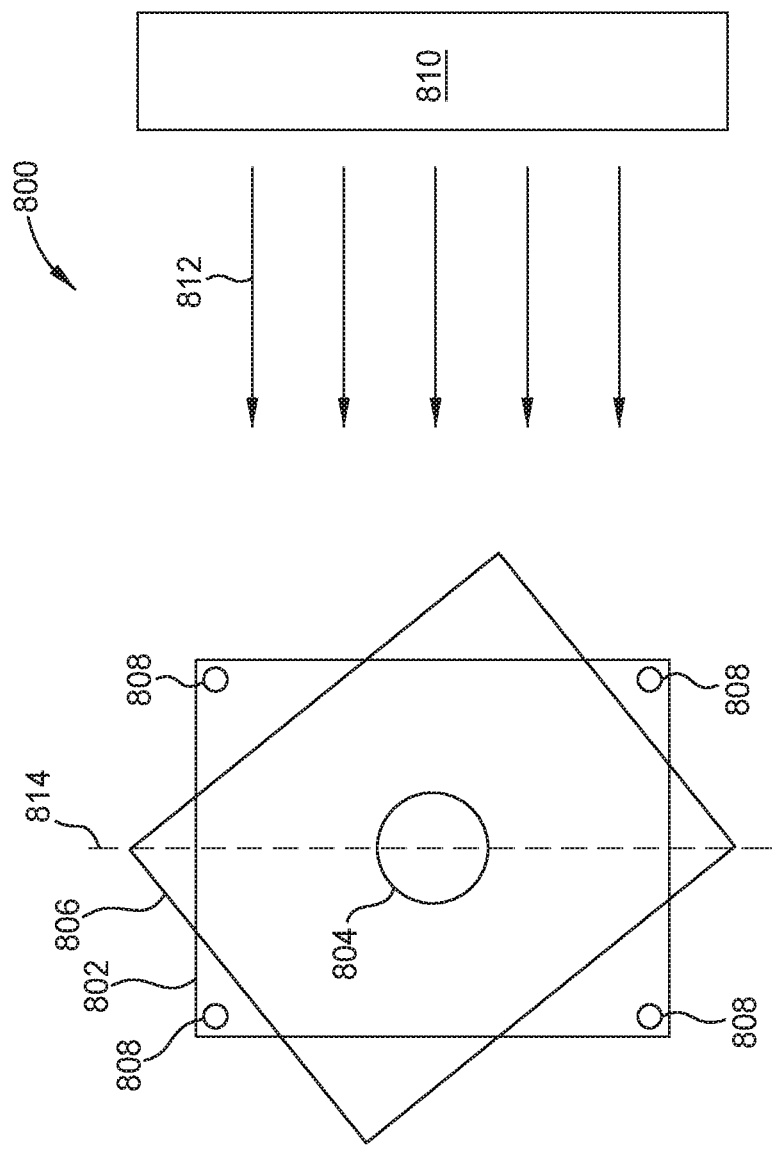
FIG. 8 is a layout view of a system for thermal energy dissipation according to some examples.

FIG. 8 illustrates a layout view of a system 800 for thermal energy dissipation according to some examples. The system 800 includes an arrangement of a thermal management apparatus on an electrical device in an orientation relative to a gas flow source 810 that can improve thermal energy dissipation. The thermal management apparatus includes a horizontal base 802, a vertical passive two-phase flow thermal carrier 804, and fins 806. The thermal management apparatus can be any of the 3D thermal management apparatuses 100, 200, 300, 400, 500, or any modification thereto, described above. The electronic device is obstructed in the layout view by the thermal management apparatus. The thermal management apparatus is above the electronic device, as shown in FIG. 7, as an example. The thermal management apparatus is secured to a PCB (not shown) by screws 808. The electronic device is attached to the PCB, as shown in FIG. 7, and can be oriented in the layout view corresponding to the horizontal base 802 of the thermal management apparatus. For example, lateral edges of the die of the electronic device can be parallel to corresponding lateral edges of the horizontal base 802.

The gas flow source 810 is disposed proximate the thermal management apparatus. The gas flow source 810 can be attached on or secured directly to the thermal management apparatus, the PCB, or a chassis or other structural component to which the PCB is mechanically coupled. The gas flow source 810 is configured to provide a flow 812 of gas and may be a fan, for example.

The fins 806 each have a distal surface that is a rectangular shape in the layout view, as stated previously, and each lateral edge of the fins 806 is oriented non-perpendicular to a direction of the flow 812. In the illustrated example, the fins 806 are oriented such that a greatest cross-sectional area of the fins 806 as arranged in the thermal management apparatus is orthogonal to the direction of the flow 812. In the illustrated example, the vertical cross-section along diagonal 814 is a greatest cross-sectional area of the fins 806 and is orthogonal to the direction of the flow 812. It is noted that this cross-sectional area is also equal to the vertical cross-section along the other diagonal (not specifically identified) of the layout of the fins 806.

The rate of the flow 812 can be based on several considerations. A first consideration may be back pressure that may be caused by the thermal management apparatus. In some examples, the gas flow source 810 is configured to implement a flow 812 that, when implemented with the gas flow impedance of the thermal management apparatus, does not create back pressure sufficient to slow the flow 812 that is generated by the gas flow source 810. Another consideration may be acoustic noise. The gas flow source 810 is configured to implement a flow 812 that does not exceed some threshold or specification for acoustic noise generated by the gas flow source 810 and thermal management apparatus.

Figure 9:
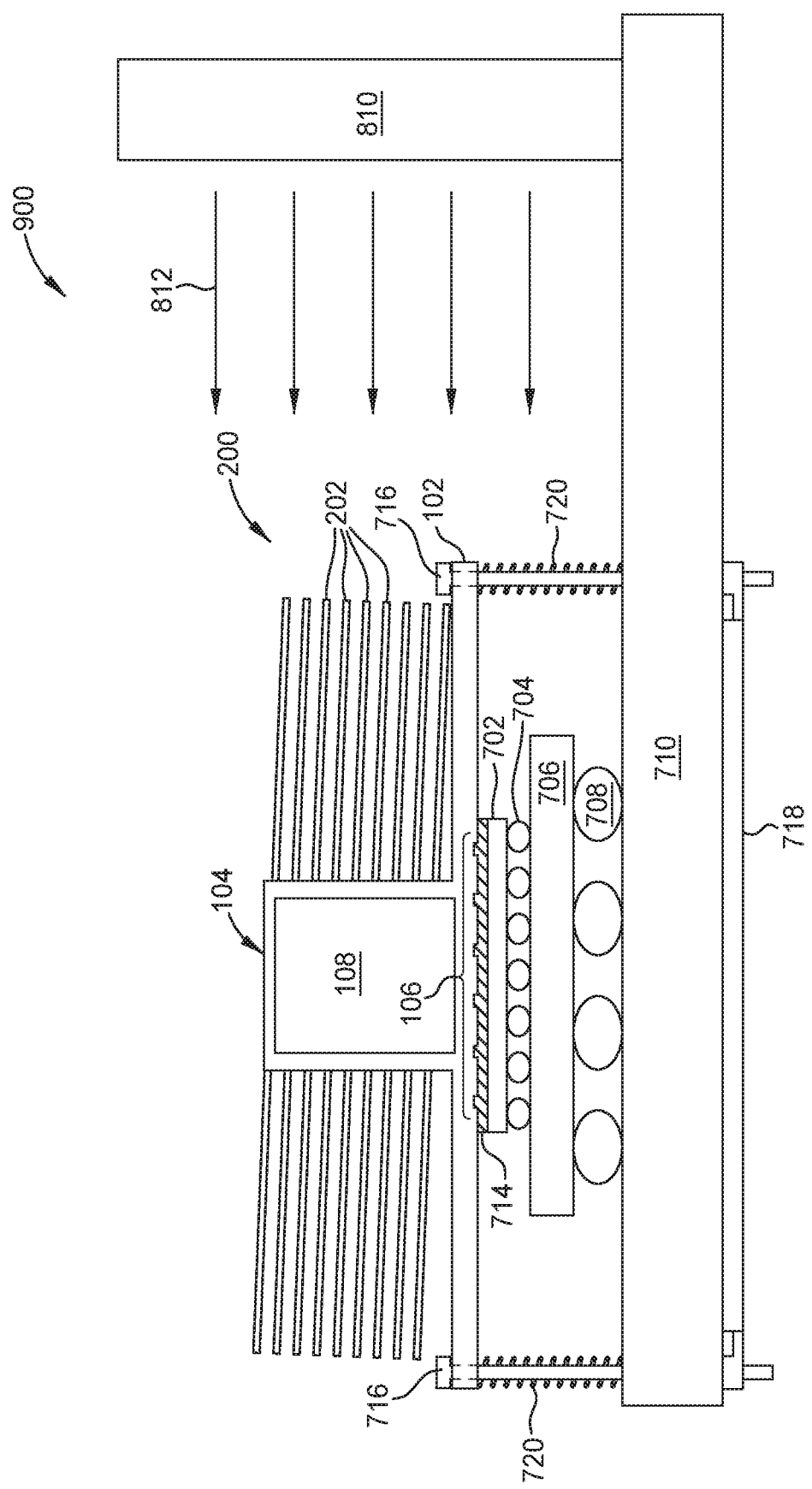
FIG. 9 is a perspective view of a system for thermal energy dissipation according to some examples.

FIG. 9 illustrates a perspective view of a system 900 for thermal energy dissipation according to some examples. The second 3D thermal management apparatus 200 of FIG. 2 is implemented in the system of FIG. 9 for illustration purposes. The system 900 implements various aspects described above with respect to FIGS. 2, 7, and 8, which will readily be understood by a person of ordinary skill in the art without further explanation. FIG. 9 illustrates that the planar fins 202 are angled or tilted downward proximate the gas flow source 810. The surfaces of the planar fins 202 distal from the horizontal base 102 are non-parallel to the direction of the flow 812. The planar fins 202 can be tilted (to be non-horizontal) around an axis in the vertical cross-section along diagonal 814 in some examples. In other examples, the planar fins 202 can be tilted around a different axis, such as an axis perpendicular to a lateral edge of the planar fins 202. Although the planar fins 202 are illustrated, other fins and thermal management apparatuses can be implemented, such as the corrugated fins 302 and/or the third 3D thermal management apparatus 300. Other 3D thermal management apparatuses, such as any of the 3D thermal management apparatuses 100, 300, 400, 500 can be used in the place of the second 3D thermal management apparatus 200 in the example of FIG. 9.

Figure 10:
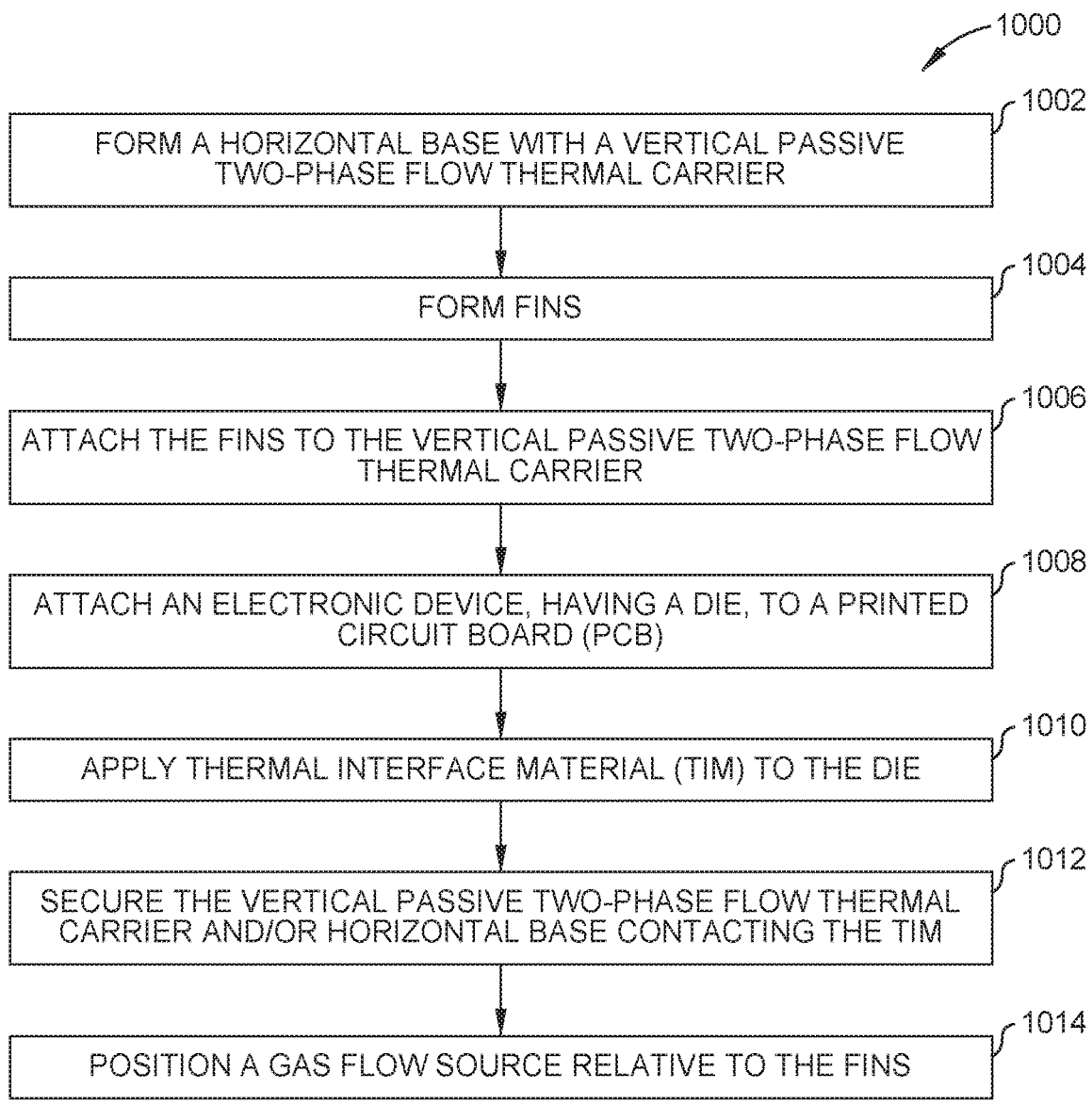
FIG. 10 is flow diagram of a method for forming a system according to some examples.

FIG. 10 is flow diagram of a method 1000 for forming a system that includes an electronic device, thermal management apparatus, and gas flow source according to some examples. The method 1000 includes operations that can be separate methods, such as a method of forming a thermal management apparatus. Some example methods can be performed with fewer operations or more operations. Various operations can also be performed sequentially or in parallel.

At block 1002, a horizontal base with a vertical passive two-phase flow thermal carrier for a thermal management apparatus is formed. The horizontal base with the vertical passive two-phase flow thermal carrier can be formed as described above with respect to FIG. 1 in some examples. In other examples, the horizontal base with the vertical passive two-phase flow thermal carrier can be formed as described above with respect to FIG. 5. At block 1004, fins are formed. The fins can be planar or corrugated and can be formed by machining, as described above. At block 1006, the fins are attached to sidewalls of the vertical passive two-phase flow thermal carrier. The fins can be attached in a horizontal or a non-horizontal configuration and can be attached by soldering, as described above.

At block 1008, an electronic device that has a die is attached to a PCB. The electronic device can include the die attached to a substrate as described above. The electronic device can be attached to the PCB by reflowing external connectors. At block 1010, a TIM is applied to the die. At block 1012, the vertical passive two-phase flow thermal carrier and/or horizontal base is secured contacting the TIM. The horizontal base can be secured by screws, bracket, and springs, such as described with respect to FIG. 7. By securing the vertical passive two-phase flow thermal carrier and/or horizontal base, the thermal management apparatus is disposed on and secured to the electronic device.

At block 1014, a gas flow source is positioned relative to the fins of the thermal management apparatus. The gas flow source can be positioned as described with respect to FIGS. 8 and 9, for example, or in another position.

Figure 11:
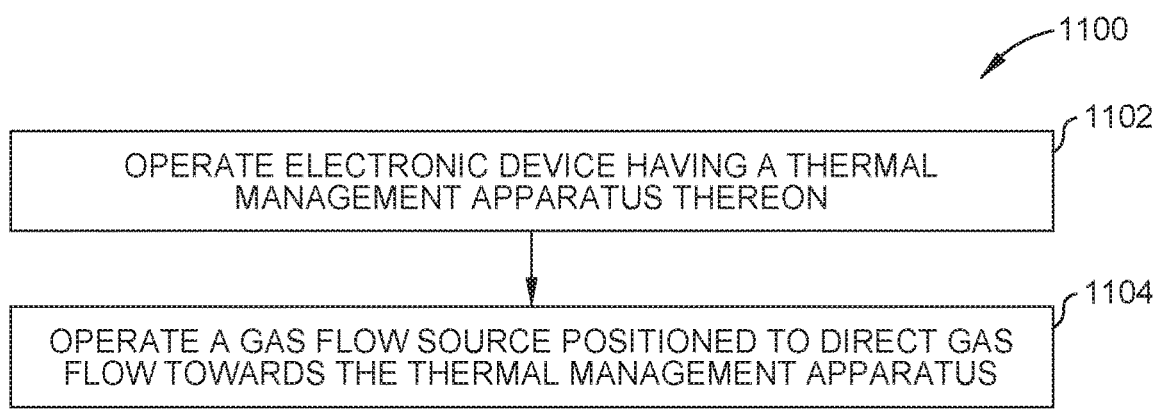
FIG. 11 is flow diagram of a method for operating a system according to some examples.

FIG. 11 is flow diagram of a method 1100 for operating a system that includes an electronic device, thermal management apparatus, and gas flow source according to some examples. At block 1102, the electronic device having the thermal management apparatus thereon is operated. The operation of the electronic device (e.g., operation of the integrated circuit on the die) can generate thermal energy. The thermal management apparatus can be any of the thermal management apparatuses described above. The thermal energy can be conducted through the thermal management apparatus as described above. At block 1104, the gas flow source is operated to direct gas flow towards the thermal management apparatus. The gas flow source and direction of gas flow can be oriented as described with respect to FIGS. 8 and 9, or another orientation. The gas flow is through, in, and around the thermal management apparatus and is capable of dissipating thermal energy from the thermal management apparatus. The gas contacts the fins, vertical passive two-phase flow thermal carrier, and/or horizontal base to absorb thermal energy by conduction, and the gas flows away from the thermal management apparatus by convection. Hence, the gas flow assists in dissipating thermal energy from the thermal management apparatus.

While the foregoing is directed to specific examples, other and further examples may be devised without departing from the basic scope thereof, and the scope thereof is determined by the claims that follow.

What is claimed is:

1. An apparatus comprising:
    a thermal management apparatus comprising:
        a primary base;
        a passive two-phase flow thermal carrier having a carrier base and one or more sidewalls extending from the carrier base, the carrier base and the one or more sidewalls being a single integral piece, the primary base being attached to the passive two-phase flow thermal carrier, the carrier base disposed within an opening in the primary base and having an exterior surface that at least a portion of which defines a die contact region, the passive two-phase flow thermal carrier having an internal volume aligned with the die contact region, a fluid being disposed in the internal volume; and fins attached to and extending from the one or more sidewalls of the passive two-phase flow thermal carrier.

2. The apparatus of claim 1, wherein the carrier base has channels in the carrier base at the die contact region.

3. The apparatus of claim 1, wherein each of the fins extends parallel to the die contact region.

4. The apparatus of claim 1, wherein each of the fins extends parallel to others of the fins, each of the fins extending non-parallel to the die contact region.

5. The apparatus of claim 1, wherein each of the fins is a planar fin.

6. The apparatus of claim 1, wherein each of the fins is a corrugated fin.

7. The apparatus of claim 1, wherein the thermal management apparatus further includes one or more L-shaped passive two-phase flow thermal carriers, each of the one or more L-shaped passive two-phase flow thermal carriers being attached to the primary base and extending through and attached to the fins.

8. The apparatus of claim 1 further comprising:
   an electronic device comprising:
      a die; and
      a substrate, the die being attached to the substrate by external connectors, and
   wherein the thermal management apparatus is disposed on the electronic device, a thermal interface material being disposed between and contacting the die contact region and the die.

9. The apparatus of claim 1, wherein the die contact region is further defined by at least a portion of the primary base.

10. The apparatus of claim 1, wherein the exterior surface of the carrier base is coplanar with a surface of the primary base.

* * * * *